(12) United States Patent
Araki

(10) Patent No.: US 11,489,242 B2
(45) Date of Patent: *Nov. 1, 2022

(54) TRANSMISSION LINE DEVICE COMPRISING A PLURALITY OF SUBSTRATES EACH HAVING SIGNAL AND GROUND CONDUCTOR PATTERNS THEREON THAT ARE JOINED TO EACH OTHER

(71) Applicant: Murata Manufacturing Co., Ltd., Nagaokakyo (JP)

(72) Inventor: Shinichi Araki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 344 days.

This patent is subject to a terminal disclaimer.

(21) Appl. No.: 16/797,027

(22) Filed: Feb. 21, 2020

(65) Prior Publication Data

US 2020/0194859 A1 Jun. 18, 2020

Related U.S. Application Data

(63) Continuation of application No. PCT/JP2018/046406, filed on Dec. 17, 2018.

(30) Foreign Application Priority Data

Dec. 28, 2017 (JP) .............................. JP2017-254831

(51) Int. Cl.
*H01P 5/02* (2006.01)
*H01P 3/08* (2006.01)
(Continued)

(52) U.S. Cl.
CPC .............. *H01P 5/028* (2013.01); *H01P 1/047* (2013.01); *H01P 3/082* (2013.01); *H01P 3/088* (2013.01);
(Continued)

(58) Field of Classification Search
CPC .......... H01P 5/028; H01P 3/088; H01P 3/082; H01P 1/047
(Continued)

(56) References Cited

U.S. PATENT DOCUMENTS 11,245,171 B2 * 2/2022 Yosui ...................... H01P 3/088
2005/0200557 A1 9/2005 Tanaka et al.
(Continued)

FOREIGN PATENT DOCUMENTS

JP 63-075074 U 5/1988
JP 2005-259359 A 9/2005
(Continued)

OTHER PUBLICATIONS

Official Communication issued in International Patent Application No. PCT/JP2018/046406, dated Feb. 26, 2019.

*Primary Examiner* — Benny T Lee
(74) *Attorney, Agent, or Firm* — Keating & Bennett, LLP

(57) ABSTRACT

A transmission line device includes first and second transmission lines. The first transmission line includes a first electrode pad that is electrically connected to a first signal conductor pattern, and a second electrode pad and a third electrode pad that are portions of a first ground conductor pattern. The second transmission line includes a fourth electrode pad that is electrically connected to a second signal conductor pattern, and a fifth electrode pad and a sixth electrode pad that are portions of a second ground conductor pattern. The first electrode pad is between the second electrode pad and the third electrode pad, and the fourth electrode pad is between the fifth electrode pad and the sixth electrode pad. The second electrode pad and the third electrode pad are larger than the first electrode pad, and the fifth electrode pad and the sixth electrode pad are larger than the fourth electrode pad.

15 Claims, 10 Drawing Sheets

(51) Int. Cl.
 *H05K 1/11* (2006.01)
 *H05K 3/36* (2006.01)
 *H01P 1/04* (2006.01)

(52) U.S. Cl.
 CPC ............. *H05K 1/111* (2013.01); *H05K 3/363* (2013.01); *H05K 2201/0141* (2013.01)

(58) Field of Classification Search
 USPC ........................................................ 333/246
 See application file for complete search history.

(56) References Cited

U.S. PATENT DOCUMENTS

| | | | |
|---|---|---|---|
| 2015/0054600 A1* | 2/2015 | Sasaki et al. | ........... H01P 3/082 333/238 |
| 2015/0054601 A1 | 2/2015 | Ikemoto et al. | |
| 2016/0064793 A1 | 3/2016 | Yosui | |
| 2016/0095211 A1 | 3/2016 | Goto | |
| 2017/0033426 A1 | 2/2017 | Baba et al. | |

FOREIGN PATENT DOCUMENTS

| | | |
|---|---|---|
| JP | 2011-171579 A | 9/2011 |
| JP | 2013-135043 A | 7/2013 |
| JP | 2016-072514 A | 5/2016 |
| WO | 2014/069061 A1 | 5/2014 |
| WO | 2015/087893 A1 | 6/2015 |
| WO | 2016/088693 A1 | 6/2016 |

\* cited by examiner

TRANSMISSION LINE DEVICE COMPRISING A PLURALITY OF SUBSTRATES EACH HAVING SIGNAL AND GROUND CONDUCTOR PATTERNS THEREON THAT ARE JOINED TO EACH OTHER

CROSS REFERENCE TO RELATED APPLICATIONS

This application claims the benefit of priority to Japanese Patent Application No. 2017-254831 filed on Dec. 28, 2017 and is a Continuation Application of PCT Application No. PCT/JP2018/046406 filed on Dec. 17, 2018. The entire contents of each application are hereby incorporated herein by reference.

BACKGROUND OF THE INVENTION

1. Field of the Invention

The present invention relates to a transmission line including an insulating substrate and a conductor pattern, and particularly, to a transmission line device in which a plurality of transmission lines are connected.

2. Description of the Related Art

International Publication No. WO2014/069061 (A1) discloses that a transmission line having a complicated shape is defined by joining pieces having a multilayer substrate structure including a transmission line.

As in a transmission line described in International Publication No. WO2014/069061 (A1), when individually produced transmission lines are joined to define one transmission line device, the individual transmission lines can be simplified, and thus the manufacturing cost can be reduced.

However, in a structure in which the transmission lines are joined, stress is easily applied to the joint portion at the time of joining or after joining, and there is a risk of peeling or disconnection. For this reason, there is a problem in that manufacturing process management for limiting the stress becomes complicated and the usage environment is restricted.

SUMMARY OF THE INVENTION

Preferred embodiments of the present invention provide transmission line devices in each of the embodiments in which poor bonding at the joint portion between the transmission lines is reduced or prevented.

A transmission line device according to a preferred embodiment of the present invention includes a first transmission line including a plurality of first insulating substrates that are stacked and a first conductor pattern located on the first insulating substrates, and a second transmission line including a plurality of second insulating substrates that are stacked and a second conductor pattern located on the second insulating substrates. The first insulating substrates and the second insulating substrates are made of a same material. The first conductor pattern includes a first signal conductor pattern, a first ground conductor pattern, a first electrode pad that is electrically connected to the first signal conductor pattern, and a second electrode pad and a third electrode pad that are electrically connected to the first ground conductor pattern or are portions of the first ground conductor pattern, and the second conductor pattern includes a second signal conductor pattern, a second ground conductor pattern, a fourth electrode pad that is electrically connected to the second signal conductor pattern, and a fifth electrode pad and a sixth electrode pad that are electrically connected to the second ground conductor pattern or are portions of the second ground conductor pattern. The first electrode pad, the second electrode pad, and the third electrode pad are arranged on a same plane, and the first electrode pad is disposed between the second electrode pad and the third electrode pad, and the fourth electrode pad, the fifth electrode pad, and the sixth electrode pad are arranged on a same plane, and the fourth electrode pad is disposed between the fifth electrode pad and the sixth electrode pad. The second electrode pad and the third electrode pad are larger than the first electrode pad, and the fifth electrode pad and the sixth electrode pad are larger than the fourth electrode pad. The first electrode pad and the fourth electrode pad are connected, the second electrode pad and the sixth electrode pad are connected, and the third electrode pad and the fifth electrode pad are connected.

According to the above configuration, since the first electrode pad is disposed between the second electrode pad and the third electrode pad, and the fourth electrode pad is disposed between the fifth electrode pad and the sixth electrode pad, the joint portion between the first electrode pad and the fourth electrode pad is effectively reinforced by the second electrode pad, the third electrode pad, the fifth electrode pad, and the sixth electrode pad. In addition, since the second electrode pad and the third electrode pad are larger than the first electrode pad, and the fifth electrode pad and the sixth electrode pad are larger than the fourth electrode pad, compared with a case where these electrode pads are the same size, a joint strength of the entire joint portion between the first transmission line and the second transmission line is high.

At least one of the second electrode pad, the third electrode pad, the fifth electrode pad, and the sixth electrode pad is preferably L-shaped or U-shaped along a periphery of the first electrode pad. According to this structure, a reinforcing action is enhanced by the electrode pad which is L-shaped or U-shaped.

It is preferable that the first ground conductor pattern includes two ground conductor patterns sandwiching the first signal conductor pattern in a stacking direction of the first insulating substrates, and a first interlayer connection conductor that electrically connects the two ground conductor patterns, the second electrode pad, and the third electrode pad; and the second ground conductor pattern includes two ground conductor patterns sandwiching the second signal conductor pattern in a stacking direction of the second insulating substrates, and a second interlayer connection conductor that electrically connects the two ground conductor patterns, the fifth electrode pad, and the sixth electrode pad. According to this structure, also at the joint portion of the transmission lines, potentials of the first ground conductor of the first transmission line and the second ground conductor pattern of the second transmission line are stabilized, and shielding properties of the first transmission line and the second transmission line are improved.

It is preferable that the first interlayer connection conductor is located immediately below at least one of the second electrode pad or the third electrode pad, and the second interlayer connection conductor is located immediately below at least one of the fifth electrode pad or the sixth electrode pad. Such a structure increases a rigidity of the joint portion between the first transmission line and the second transmission line and a joint strength of the electrode pad immediately below which the interlayer connection conductor is located, to the insulating substrate. In addition, the shielding property at the joint portion between the first transmission line and the second transmission line is further improved.

It is preferable that the first interlayer connection conductor includes a plurality of first interlayer connection conductors located immediately below at least one of the second electrode pad or the third electrode pad, and the second interlayer connection conductor includes a plurality of second interlayer connection conductors located immediately below at least one of the fifth electrode pad or the sixth electrode pad. This further increases the rigidity of the joint portion between the first transmission line and the second transmission line, and effectively increases the joint strength of the electrode pad immediately below which the interlayer connection conductor is located, to the insulating substrate. In addition, the shielding property at the joint portion between the first transmission line and the second transmission line is effectively improved.

It is preferable that the second electrode pad and the third electrode pad are located at a position to sandwich the first electrode pad in an extending direction of the first signal conductor pattern, and the fifth electrode pad and the sixth electrode pad are located at a position to sandwich the fourth electrode pad in an extending direction of the second signal conductor pattern. According to this structure, since the stress applied to the joint portion between the first transmission line and the second transmission line is received by the electrode pad having a large area, the joint strength of the joint portion between the first transmission line and the second transmission line is increased.

The second electrode pad and the third electrode pad may be located at a position to sandwich the first electrode pad in a direction orthogonal or substantially orthogonal to an extending direction of the first signal conductor pattern, and the fifth electrode pad and the sixth electrode pad may be located at a position to sandwich the fourth electrode pad in a direction orthogonal or substantially orthogonal to an extending direction of the second signal conductor pattern. According to this structure, even when a torsional stress is applied to the joint portion between the first transmission line and the second transmission line, the joint strength of the joint portion between the first transmission line and the second transmission line to the torsional stress is increased.

According to preferred embodiments of the present invention, transmission line devices in each of the embodiments in which poor bonding at the joint portion between the transmission lines is reduced or prevented are obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
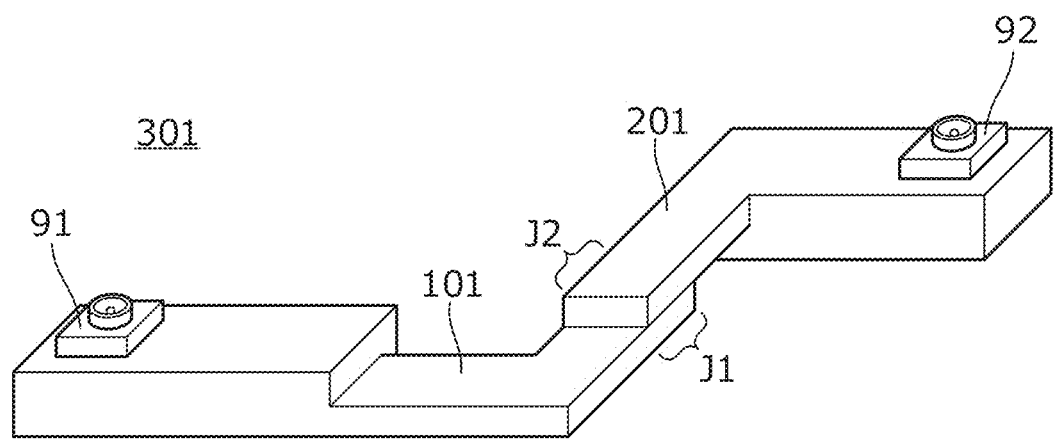
FIG. 1 is a perspective view of a transmission line device according to a first preferred embodiment of the present invention.

Hereinafter, several specific examples will be described in detail with reference to the drawings to show a plurality of preferred embodiments of the present invention. In each figure, the same reference numerals are assigned to the same or substantially the same portions. In consideration of ease of explanation and understanding of the main points, the preferred embodiments are shown separately for convenience, but partial replacement or combination of configurations shown in different preferred embodiments is possible. In the second and subsequent preferred embodiments, descriptions of matters common to the first preferred embodiment are omitted, and only different points will be described. In particular, the same advantageous operational effect by the same configuration will not be successively described for each preferred embodiment.

First Preferred Embodiment

FIG. 1 is a perspective view of a transmission line device 301 according to a first preferred embodiment of the present invention. In the transmission line device 301, a first transmission line 101 and a second transmission line 201 are joined.

The first transmission line 101 includes a joint portion J1 with the second transmission line 201, and the second transmission line 201 includes a joint portion J2 with the first transmission line 101. That is, the transmission line device 301 is defined by joining the joint portion J1 of the first transmission line 101 and the joint portion J2 of the second transmission line. Coaxial connectors 91 and 92 are mounted on the transmission line device 301. The transmission line device 301 is used as a cable including the coaxial connectors 91 and 92.

Figure 2:
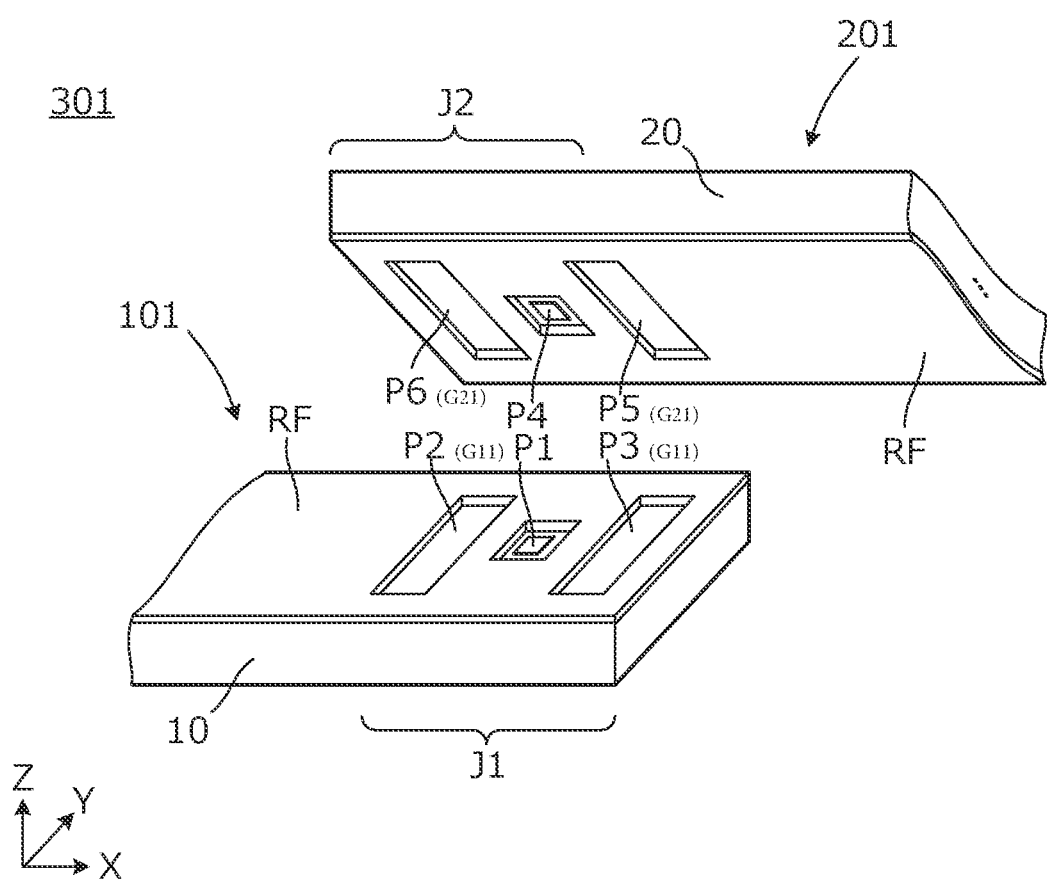
FIG. 2 is a partial perspective view showing a structure of a joint portion between a first transmission line and a second transmission line.

FIG. 2 is a partial perspective view showing a structure of the joint portion between the first transmission line 101 and the second transmission line 201, and includes X-Y-Z coordinate axes that correspond to the three-dimensional arrangement of the transmission line device 301. FIG. 2 shows a state before the first transmission line 101 and the second transmission line 201 are joined.

The first transmission line 101 includes a plurality of stacked first insulating substrates and a first conductor pattern located on each of the first insulating substrates. The first conductor pattern includes a first signal conductor pattern, a first ground conductor pattern, a first electrode pad P1 that is electrically connected to the first signal conductor pattern, and a second electrode pad P2 and a third electrode pad P3 that are portions of the first ground conductor pattern.

The second transmission line 201 includes a plurality of stacked second insulating substrates and a second conductor pattern located on each of the second insulating substrates. The second conductor pattern includes a second signal conductor pattern, a second ground conductor pattern, a fourth electrode pad P4 that is electrically connected to the second signal conductor pattern, and a fifth electrode pad P5 and a sixth electrode pad P6 that are portions of the second ground conductor pattern.

The first transmission line 101 includes a first stacked insulator 10 provided by stacking a plurality of first insulating substrates, and a resist film RF located on the surface (upper surface in the direction shown in FIG. 2) of the first stacked insulator 10. The second transmission line 201 includes a second stacked insulator 20 provided by stacking a plurality of second insulating substrates, and a resist film RF located on the surface (lower surface in the direction shown in FIG. 2) of the second stacked insulator 20.

The first insulating substrate and the second insulating substrate are both flexible substrates preferably made of, for example, liquid crystal polymer (LCP), poly ether ether ketone (PEEK), or the like, and are made of the same material. The resist film RF is a printable insulating resin material, for example. Both the first conductor pattern and the second conductor pattern are preferably obtained by patterning Cu foil, for example. The resist film RF is not limited to a film provided by printing an insulating resin material, and the resist film RF may be provided by, for example, adhering a cover film made of an insulating resin film or the like. Further, the patterning of the cover film may be performed before or after adhering the insulating resin film or the like.

The first electrode pad P1, the second electrode pad P2, and the third electrode pad P3 are arranged on the same plane, and the first electrode pad P1 is disposed between the second electrode pad P2 and the third electrode pad P3. The fourth electrode pad P4, the fifth electrode pad P5, and the sixth electrode pad P6 are arranged on the same plane, and the fourth electrode pad P4 is disposed between the fifth electrode pad P5 and the sixth electrode pad P6.

The second electrode pad P2 and the third electrode pad P3 are larger than the first electrode pad P1. Similarly, the fifth electrode pad P5 and the sixth electrode pad P6 are larger than the fourth electrode pad P4.

In a state where the first joint portion J1 of the first transmission line 101 and the second joint portion J2 of the second transmission line 201 are joined, the first electrode pad P1 and the fourth electrode pad P4 are connected, the second electrode pad P2 and the sixth electrode pad P6 are connected, and the third electrode pad P3 and the fifth electrode pad P5 are connected.

Figure 3:
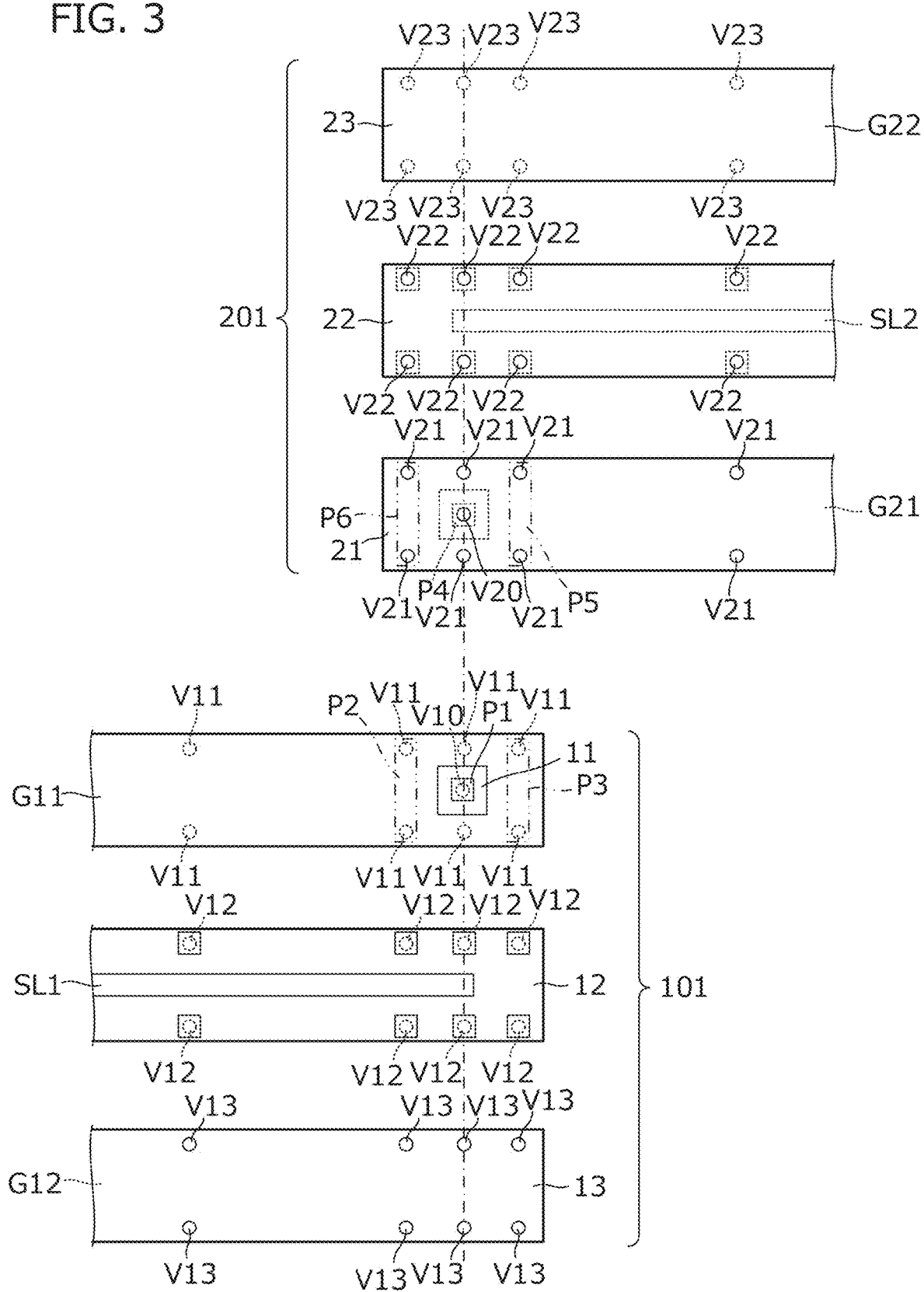
FIG. 3 is a plan view showing a shape of a first conductor pattern located on each insulating substrate of the first transmission line and a shape of a second conductor pattern located on each insulating substrate of the second transmission line.

FIG. 3 is a plan view showing a shape of the first conductor pattern located on each insulating substrate of the first transmission line 101 and a shape of the second conductor pattern located on each insulating substrate of the second transmission line 201. However, FIG. 3 shows a state before the resist film RF (FIG. 2) is provided by printing.

Figure 4A:
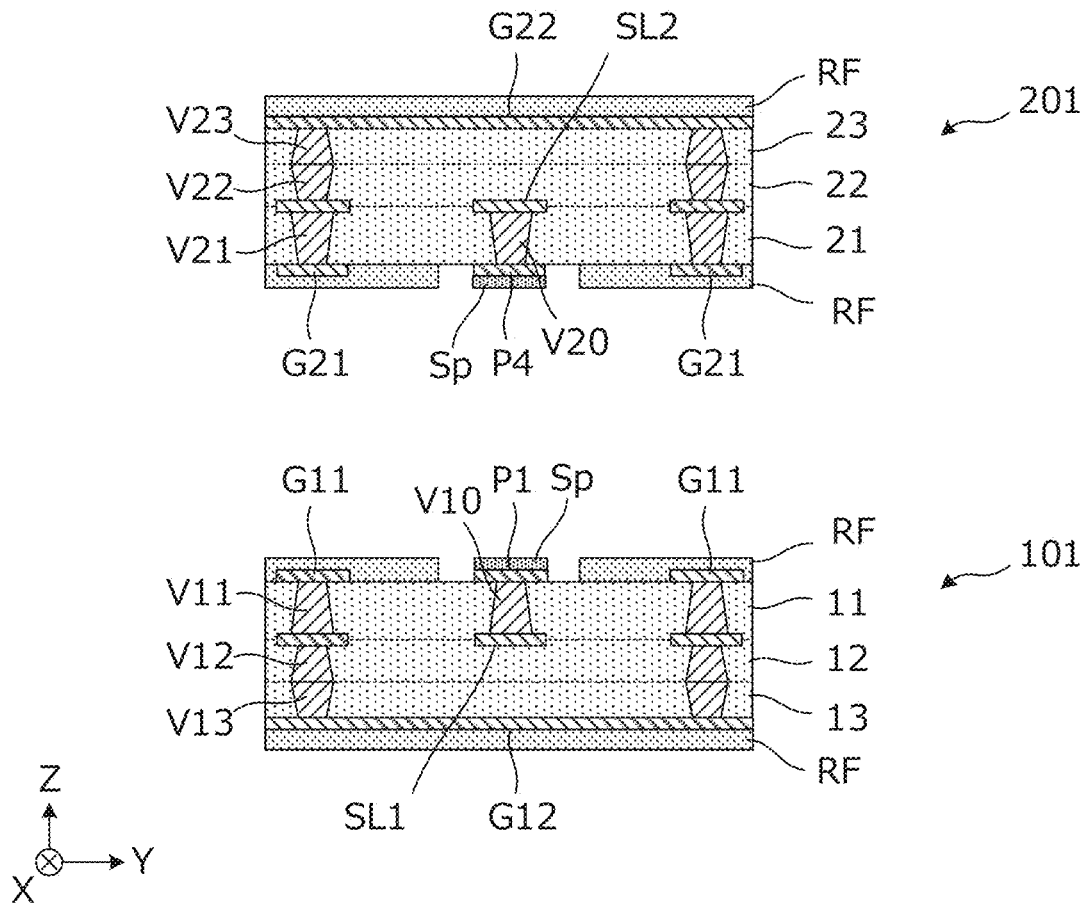
FIG. 4A is a cross-sectional view of the first transmission line and the second transmission line.
Figure 4B:
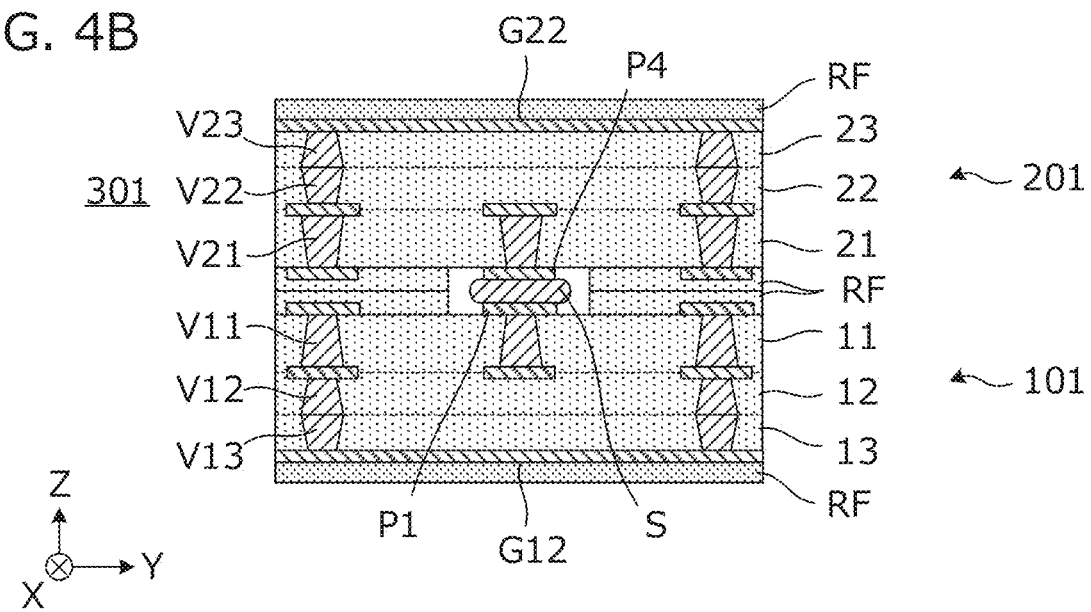
FIG. 4B is a cross-sectional view in a state in which the first transmission line and the second transmission line are joined.
Figure 5A:
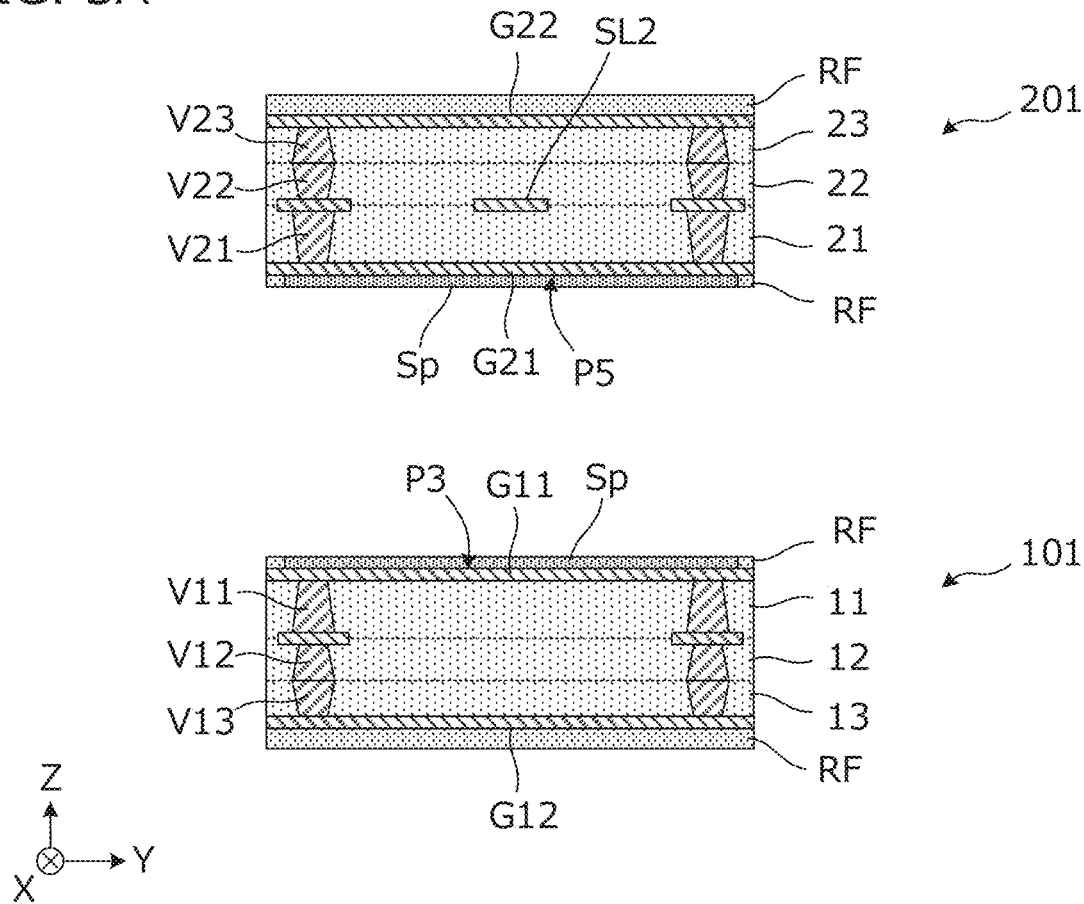
FIG. 5A is a cross-sectional view of the first transmission line and the second transmission line.
Figure 5B:
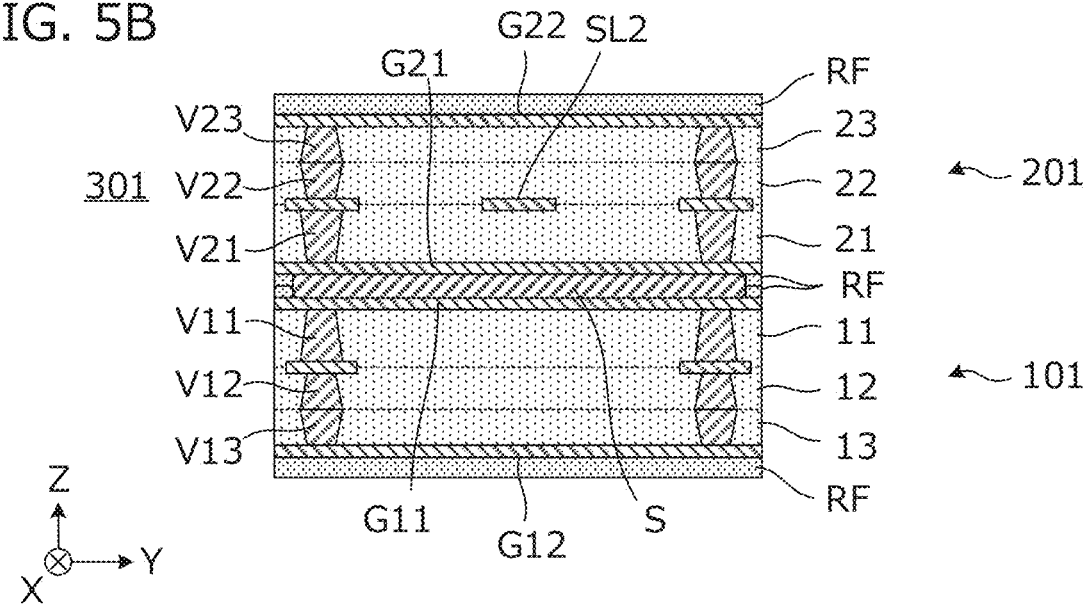
FIG. 5B is a cross-sectional view in a state in which the first transmission line and the second transmission line are joined.

FIG. 4A is a cross-sectional view of the first transmission line 101 and the second transmission line 201, and FIG. 4B is a cross-sectional view in a state where the first transmission line 101 and the second transmission line 201 are joined. Each of FIGS. 4A and 4B is a cross-sectional view at a dashed line portion in FIG. 3. FIG. 5A is a cross-sectional view of the first transmission line 101 and the second transmission line 201, and FIG. 5B is a cross-sectional view in a state in which the first transmission line 101 and the second transmission line 201 are joined. Each of FIGS. 5A and 5B is a cross-sectional view at a portion passing through the third electrode pad P3 and the fifth electrode pad P5. As shown by the X-Y-Z axes included in each of FIGS. 4A, 4B, 5A, and 5B, the cross-sectional views in each of FIGS. 4A, 4B, 5A, and 5B is in a direction that is parallel or substantially parallel to each of the Y axis and the Z axis and orthogonal or substantially orthogonal to the X axis.

As shown in FIG. 3, the first transmission line 101 includes first insulating substrates 11, 12, and 13. The first electrode pad P1 and an upper first ground conductor pattern G11 are located on the upper surface of the first insulating substrate 11. A first signal conductor pattern SL1 and electrode pads to which a plurality of interlayer connection conductors V12 are connected are located on the upper surface of the first insulating substrate 12. A lower first ground conductor pattern G12 is located on the lower surface of the first insulating substrate 13.

The upper first ground conductor pattern G11 and the lower first ground conductor pattern G12 are connected via first interlayer connection conductors V11, V12, and V13. The first electrode pad P1 and one end of the first signal conductor pattern SL1 are connected via an interlayer connection conductor V10. The interlayer connection conductors V10, V11, V12, and V13 are obtained by solidifying a conductive paste containing metal.

The second transmission line 201 includes second insulating substrates 21, 22, and 23. The fourth electrode pad P4 and a lower second ground conductor pattern G21 are located on the lower surface of the second insulating substrate 21. A second signal conductor pattern SL2 and electrode pads to which a plurality of interlayer connection conductors V22 are connected are located on the lower surface of the second insulating substrate 22. An upper second ground conductor pattern G22 is located on the upper surface of the second insulating substrate 23.

The lower second ground conductor pattern G21 and the upper second ground conductor pattern G22 are connected via second interlayer connection conductors V21, V22, and V23. The fourth electrode pad P4 and one end of the second signal conductor pattern SL2 are connected via an interlayer connection conductor V20.

In the present preferred embodiment, a first strip line is defined by the first signal conductor pattern SL1, the ground conductor patterns G11 and G12, and the first insulating substrates 11, 12, and 13 therebetween. Similarly, a second strip line is defined by the second signal conductor pattern SL2, the ground conductor patterns G21 and G22, and the second insulating substrates 21, 22, and 23 therebetween. Then, a transmission line device in which the first strip line and the second strip line are connected is defined by connecting the first transmission line 101 and the second transmission line 201.

In the first transmission line 101 shown in FIG. 3, two portions each surrounded by a two-dot chain line are openings in the resist film RF (FIG. 2). The upper first ground conductor pattern G11 exposed from these openings corresponds to the second electrode pad P2 and the third electrode pad P3. Similarly, in the second transmission line 201, two portions each surrounded by a two-dot chain line are openings in the resist film RF, and the lower second ground conductor pattern G21 exposed from the openings corresponds to the fifth electrode pad P5 and the sixth electrode pad P6. As described above, the second electrode pad P2 and the third electrode pad P3 are located at positions sandwiching the first electrode pad P1 in the extending direction of the first signal conductor pattern SL1. Similarly, the fifth electrode pad P5 and the sixth electrode pad P6 are located at positions sandwiching the fourth electrode pad P4 in the extending direction of the second signal conductor pattern SL2.

As described above, since the second electrode pad P2 and the third electrode pad P3 sandwich the first electrode pad P1 in the extending direction of the first signal conductor pattern SL1, the joint portion in which the first electrode pad P1 is provided is reinforced by the second electrode pad P2 and the third electrode pad P3. Similarly, since the fifth electrode pad P5 and the sixth electrode pad P6 sandwich the fourth electrode pad P4 in the extending direction of the second signal conductor pattern SL2, the joint portion is reinforced by the fifth electrode pad P5 and the sixth electrode pad P6. In particular, peeling resistance of the joint portion increases against stress that tends to bend the extending direction of the first signal conductor pattern SL1 and the second signal conductor pattern SL2 in the stacking direction of the insulating substrate.

In the first transmission line 101, two interlayer connection conductors V11 among the interlayer connection conductors V11 located on the first insulating substrate 11 are located immediately below the second electrode pad P2. Of the interlayer connection conductors V11 located on the first insulating substrate 11, two interlayer connection conductors V11 are located immediately below the third electrode pad P3. This structure increases the rigidity of the joint portion between the first transmission line and the second transmission line and a joint strength of the electrode pad immediately below which the interlayer connection conductors are located, to the insulating substrate. In addition, the shielding property at the joint portion between the first transmission line and the second transmission line is further improved.

Further, two interlayer connection conductors V12 are located immediately below the two interlayer connection conductors V11, and two interlayer connection conductors V13 are located immediately below the two interlayer connection conductors V12. This further increases the joint strength and shielding property.

As shown in FIGS. 3 and 5A, in the second transmission line 201, two interlayer connection conductors V21 among the interlayer connection conductors V21 located on the second insulating substrate 21 are located immediately adjacent to the fifth electrode pad P5 in the stacking direction of the plurality of second insulating substrates 21-23 (immediately adjacent to can be considered to be immediately below or immediately above). As shown in FIG. 3, of the interlayer connection conductors V21 located on the second insulating substrate 21, two interlayer connection conductors V21 are located immediately adjacent to (immediately above or immediately below) the sixth electrode pad P6 in the stacking direction of the plurality of second insulating substrates 21-23. Further, as shown in FIGS. 3 and 5A, two interlayer connection conductors V22 are located immediately adjacent to (immediately below or immediately above) the two interlayer connection conductors V21, and two interlayer connection conductors V23 are located immediately adjacent to (immediately below or immediately above) the two interlayer connection conductors V22.

The advantageous operational effects achieved by the structure of the second transmission line 201 are the same as the advantageous operational effects achieved by the first transmission line 101 described above.

As shown in FIGS. 4A and 5A, the first electrode pad P1 (FIG. 4A) and the fourth electrode pad P4 (FIG. 4A) are precoated with a solder paste Sp. Also, the second electrode pad P2 and the sixth electrode pad P6 are precoated with a solder paste Sp, and similarly, the third electrode pad P3 (FIG. 5A) and the fifth electrode pad P5 (FIG. 5A) are precoated with a solder paste Sp. Then, the first joint portion J1 of the first transmission line 101 and the second joint portion J2 of the second transmission line 201 shown in FIG. 2 are overlapped with each other and soldered by being heated and pressed by a hot bar or the like, for example. As a result, as shown in FIGS. 4B and 5B, the first electrode pad P1 and the fourth electrode pad P4 are connected via solder S as shown in FIG. 4B. Similarly, the second electrode pad P2 and the sixth electrode pad P6 are connected via solder, and the third electrode pad P3 and the fifth electrode pad P5 are connected via solder S.

The solder paste Sp may be precoated on one of the first electrode pad P1 and the fourth electrode pad P4. Similarly, the solder paste Sp may be precoated on one of the second electrode pad P2 and the sixth electrode pad P6, or the solder paste Sp may be precoated on one of the third electrode pad P3 and the fifth electrode pad P5.

In addition, the connection may be made using a conductive paste other than soldering. That is, by applying a conductive paste to one or both of the first joint portion J1 of the first transmission line 101 and the second joint portion J2 of the second transmission line 201, and by solidifying the conductive paste by heating, the first joint portion J1 of the first transmission line 101 and the second joint portion J2 of the second transmission line 201 can be joined.

The coaxial connector 91 shown in FIG. 1 is connected to the other end of the first signal conductor pattern SL1, and the coaxial connector 92 shown in FIG. 1 is connected to the other end of the second signal conductor pattern SL2.

Figure 6:
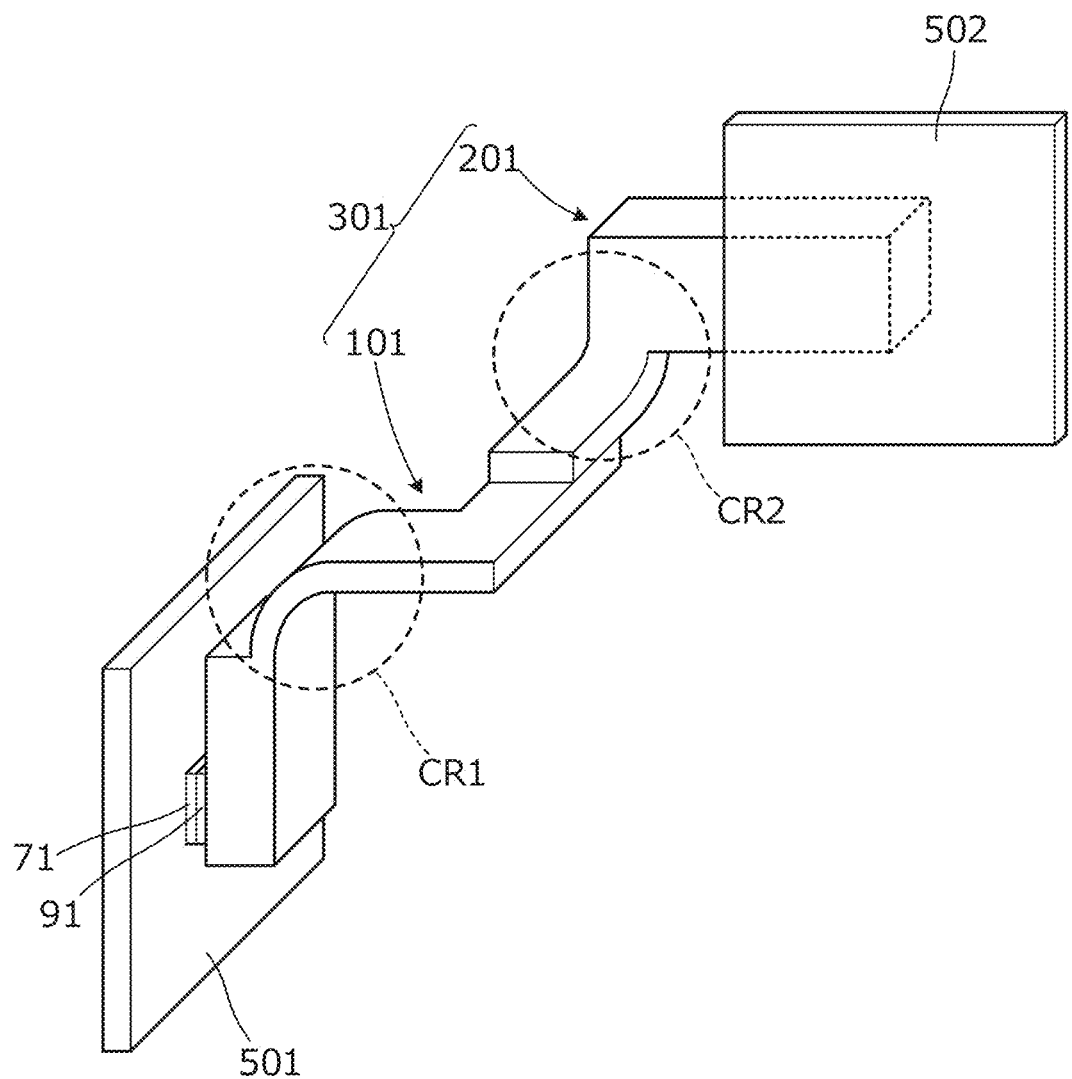
FIG. 6 is a perspective view showing a mounting structure of the transmission line device.

FIG. 6 is a perspective view showing a mounting structure of the transmission line device 301 of the present preferred embodiment. As shown in FIG. 6, the transmission line device 301 includes bent portions CR1 and CR2. The transmission line device 301 is connected between mounting substrates 501 and 502 with a flexible portion thereof being bent. The connector 91 of the transmission line device 301 is connected to a receptacle 71 mounted on the mounting substrate 501. Similar to the connector 91 of the transmission line device 301 connected to the receptable 71 mounted on the mounting substrate 501, the connector 92 (FIG. 1) of the transmission line device 301 is connected to a receptacle mounted on the mounting substrate 502.

Thus, when the transmission line device 301 is bent and mounted, a stress is applied that tends to cause peeling off the joint portions of the first transmission line 101 and the second transmission line 201 from each other.

According to the present preferred embodiment, as shown in FIG. 2, since the first electrode pad P1 is disposed between the second electrode pad P2 and the third electrode pad P3, and the fourth electrode pad P4 is disposed between the fifth electrode pad P5 and the sixth electrode pad P6, the joint portion between the first electrode pad P1 and the fourth electrode pad P4 is effectively reinforced by the second electrode pad P2, the third electrode pad P3, the fifth electrode pad P5, and the sixth electrode pad P6. In addition, as shown in FIG. 2, since the second electrode pad P2 and the third electrode pad P3 are larger than the first electrode pad P1, and the fifth electrode pad P5 and the sixth electrode pad P6 are larger than the fourth electrode pad P4, compared with a case where each of the electrode pads has the same size, the joint strength of the entire joint portion between the first transmission line 101 and the second transmission line 201 is high.

Further, according to the present preferred embodiment, as shown in FIGS. 3 and 4A, the first signal conductor pattern SL1 is sandwiched between the two ground conductor patterns G11 and G12 in the stacking direction of the first insulating substrates 11, 12, and 13, and the two ground conductor patterns G11 and G12, the second electrode pad P2, and the third electrode pad P3 are connected by the interlayer connection conductors V11, V12, and V13. As shown in FIGS. 3 and 4A, the second signal conductor pattern SL2 is sandwiched between two ground conductor patterns G21 and G22 in the stacking direction of the second insulating substrates 21, 22, and 23, and the two ground conductor patterns G21 and G22, the fifth electrode pad P5, and the sixth electrode pad P6 are connected by the interlayer connection conductors V21, V22, and V23. Therefore, the potentials of the first ground conductor patterns G11 and G12 of the first transmission line 101 and the second ground conductor patterns G21 and G22 of the second transmission line 201 are also stabilized at the joint portion of the transmission lines, and the shielding properties of the first transmission line 101 and the second transmission line 201 are increased.

Further, according to the present preferred embodiment, as shown in FIG. 3, the interlayer connection conductor is located immediately below at least one of the second electrode pad P2, the third electrode pad P3, the fifth electrode pad P5, and the sixth electrode pad P6. This increases the rigidity of the joint portion between the first transmission line 101 (FIG. 1) and the second transmission line 201 (FIG. 1) and the joint strength of the electrode pad immediately below which the interlayer connection conductor is located, to the insulating substrate. That is, since the interlayer connection conductor V11, V12, V13, V21, V22, V23 (FIG. 11 is provided by solidifying conductive paste including metal, its rigidity is higher than that of the insulating substrate 11, 12, 13, 21, 22, 23 (FIG. 3), which is a resin, and the rigidity of the entire joint portion of the transmission lines is increased by these interlayer connection conductors V11, V12, V13, V21, V22, and V23.

In addition, according to the present preferred embodiment, as shown in FIGS. 2 and 3, the second electrode pad P2 and the third electrode pad P3 are located at positions sandwiching the first electrode pad P1 in the extending direction of the first signal conductor pattern SL1. In addition, as shown in FIGS. 2 and 3, the fifth electrode pad P5 and the sixth electrode pad P6 are located at positions sandwiching the fourth electrode pad P4 in the extending direction of the second signal conductor pattern SL2. Therefore, a stress applied to the joint portion between the first transmission line 101 and the second transmission line 201 is received by the electrode pads having large areas, and thus the joint strength of the joint portion between the first transmission line 101 and the second transmission line 201 is increased.

Second Preferred Embodiment

In a second preferred embodiment of the present invention, an example in which the configuration of the conductor pattern at the joint portion between the first transmission line and the second transmission line is different from that in the first preferred embodiment will be described.

Figure 7:
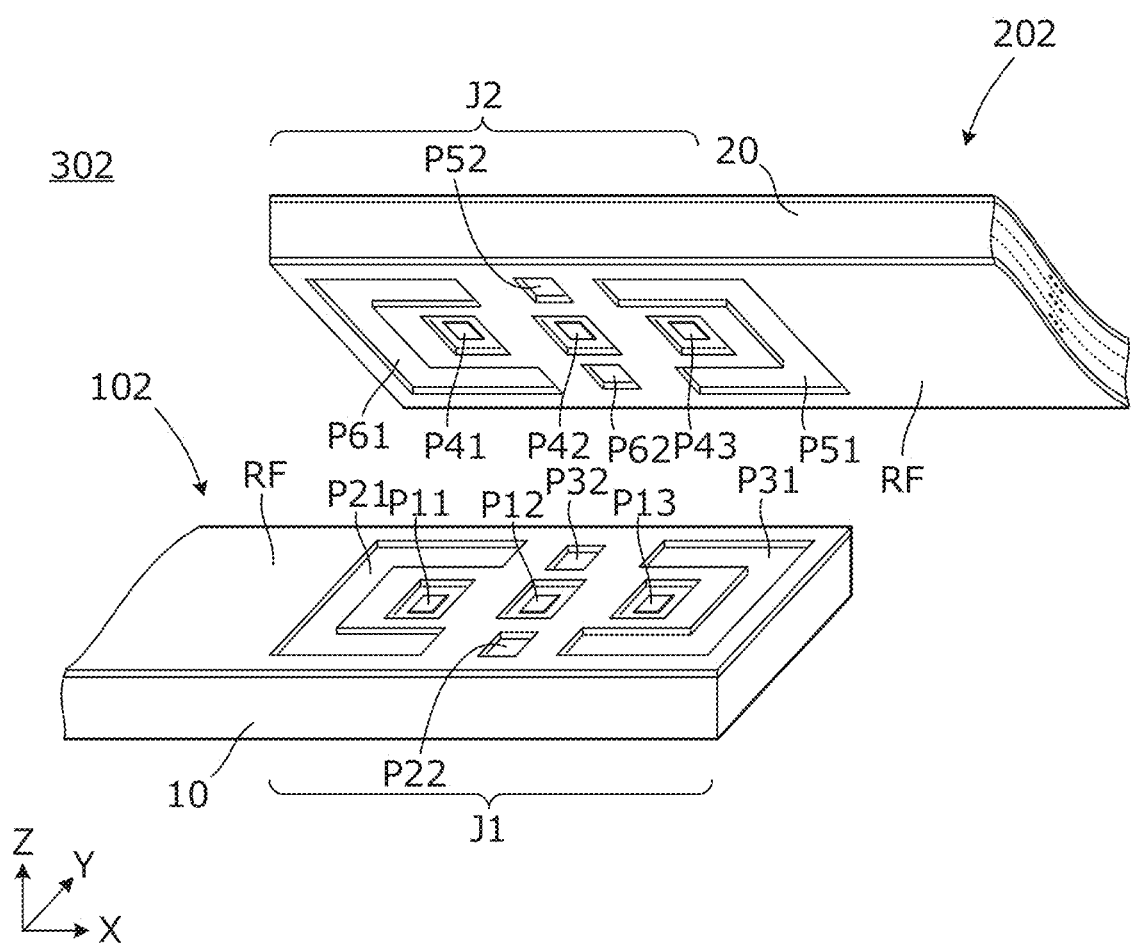
FIG. 7 is a perspective view of a transmission line device according to a second preferred embodiment of the present invention.

FIG. 7 is a perspective view of a transmission line device 302 according to the second preferred embodiment, and includes X-Y-Z coordinate axes that correspond to the three-dimensional arrangement of the transmission line device 302. FIG. 7 shows a state before a first transmission line 102 and a second transmission line 202 are joined. In the transmission line device 302, the first transmission line 102 and the second transmission line 202 are joined.

The first transmission line 102 includes a plurality of stacked first insulating substrates and a first conductor pattern located on each of the first insulating substrates. The first conductor pattern includes three first signal conductor patterns, a plurality of first ground conductor patterns, first electrode pads P11, P12, and P13 that are respectively electrically connected to the first signal conductor patterns, and second electrode pads P21 and P22 and third electrode pads P31 and P32, which are portions of the first ground conductor patterns.

The second transmission line 202 includes a plurality of stacked second insulating substrates and a second conductor pattern located on each of the second insulating substrates. The second conductor pattern includes three second signal conductor patterns, a plurality of second ground conductor patterns, fourth electrode pads P41, P42, and P43 that are respectively electrically connected to the second signal conductor patterns, and fifth electrode pads P51 and P52 and sixth electrode pads P61 and P62, which are portions of the second ground conductor patterns.

The first transmission line 102 includes a first stacked insulator 10 provided by stacking a plurality of first insulating substrates, and a resist film RF located on the surface (upper surface in the direction shown in FIG. 7) of the first stacked insulator 10. The second transmission line 202 includes a second stacked insulator 20 provided by stacking a plurality of second insulating substrates, and a resist film RF located on the surface (lower surface in the direction shown in FIG. 7) of the second stacked insulator 20. The first insulating substrate and the second insulating substrate are made of the same material.

The first electrode pads P11, P12, and P13, the second electrode pads P21 and P22, and the third electrode pads P31 and P32 are arranged on the same plane. The first electrode pads P11, P12, and P13 are disposed between the second electrode pad P21 and the third electrode pad P31, and are disposed between the second electrode pad P22 and the third electrode pad P32.

Similarly, the fourth electrode pads P41, P42, and P43, the fifth electrode pads P51 and P52, and the sixth electrode pads P61 and P62 are arranged on the same plane. The fourth electrode pads P41, P42, and P43 are disposed between the fifth electrode pad P51 and the sixth electrode pad P61, and are disposed between the fifth electrode pad P52 and the sixth electrode pad P62.

As described above, in the present preferred embodiment, the second electrode pad P21 and the third electrode pad P31 are located at positions sandwiching the first electrode pads P11, P12, and P13 in the extending direction of the first signal conductor pattern (direction along the X axis), and the second electrode pad P22 and the third electrode pad P32 are located at positions sandwiching the first electrode pad P12 in a direction (direction along the Y axis) orthogonal or substantially orthogonal to the extending direction of the first signal conductor pattern. Similarly, the fifth electrode pad P51 and the sixth electrode pad P61 are located at positions sandwiching the fourth electrode pads P41, P42, and P43 in the extending direction (direction along the X axis) of the second signal conductor pattern, and the fifth electrode pad P52 and the sixth electrode pad P62 are located at positions sandwiching the fourth electrode pad P42 in a direction (direction along the Y axis) orthogonal or substantially orthogonal to the extending direction of the second signal conductor pattern.

The second electrode pad P21 and the third electrode pad P31 are larger than the first electrode pads P11, P12, and P13. Similarly, the fifth electrode pad P51 and the sixth electrode pad P61 are larger than the fourth electrode pads P41, P42, and P43.

The second electrode pad P21 and the sixth electrode pad P61 are U-shaped along the periphery of the first electrode pad P11 and the fourth electrode pad P41, respectively. Similarly, the third electrode pad P31 and the fifth electrode pad P51 are U-shaped along the periphery of the first electrode pad P13 and the fourth electrode pad P43, respectively.

Figure 8A:
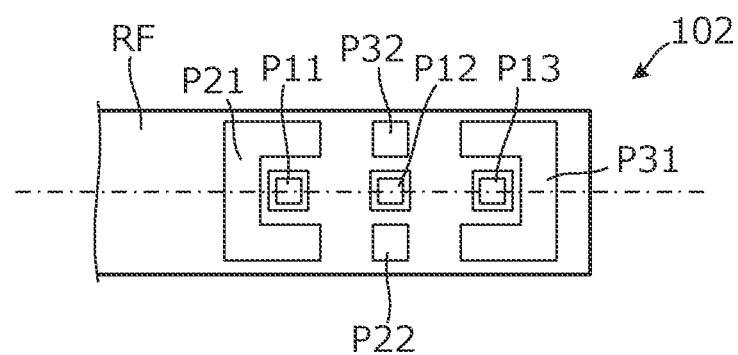
FIG. 8A is a partial plan view of a first transmission line.
Figure 8B:
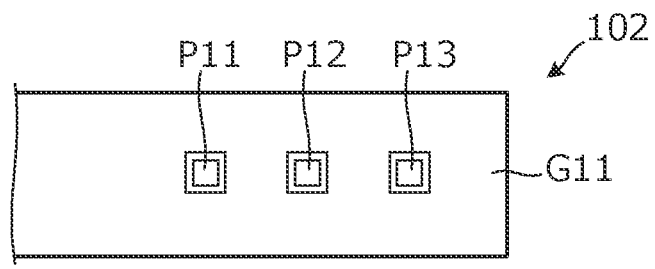
FIG. 8B is a partial plan view of the first transmission line before a resist film RF is provided.
Figure 8B:
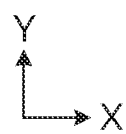
Figure 9:
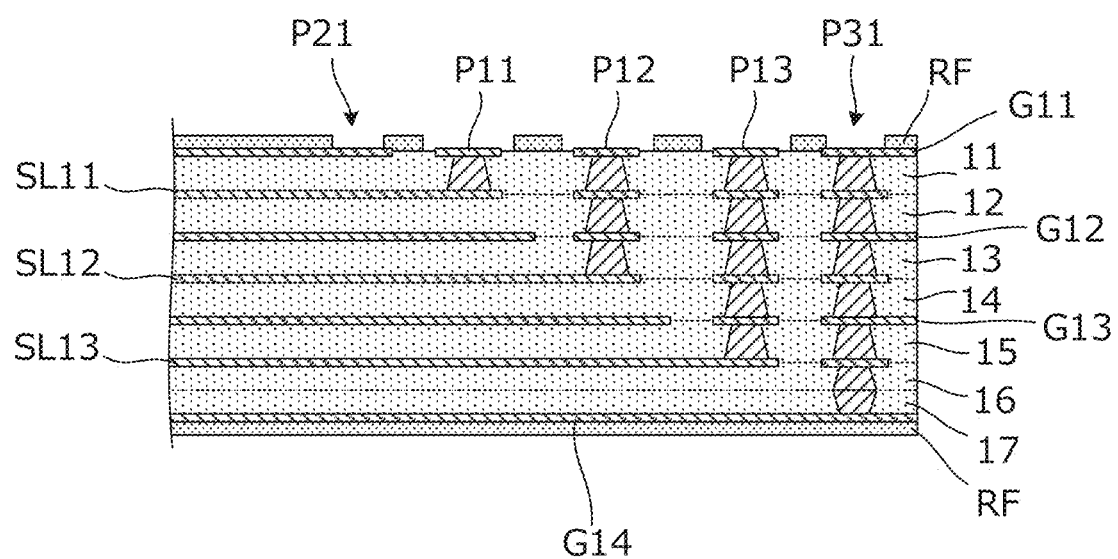
FIG. 9 is a vertical cross-sectional view at a dashed line portion shown in FIG. 8A.

FIG. 8A is a partial plan view of the first transmission line 102, and FIG. 8B is a partial plan view of the first transmission line 102 before the resist film RF (FIG. 7) is provided. As shown by the X-Y axes included in FIG. 8B, the partial plan view in FIG. 8B is in a direction that is parallel or substantially parallel to each of the X axis and the Y axis. FIG. 9 is a vertical cross-sectional view at a dashed line portion shown in FIG. 8A.

The first transmission line 102 of the present preferred embodiment includes first insulating substrates 11, 12, 13, 14, 15, 16, and 17 as shown in FIG. 9. The first electrode pads P11, P12, and P13 and a first ground conductor pattern G11 (FIGS. 8B and 9) are located on the upper surface of the first insulating substrate 11. First signal conductor patterns SL11, SL12, and SL13 are located on the upper surfaces of the first insulating substrates 12, 14, and 16, respectively as shown in FIG. 9. First ground conductor patterns G12 and G13 are located on the upper surfaces of the first insulating substrates 13 and 15, respectively as shown in FIG. 9. A first ground conductor pattern G14 is located on the lower surface of the insulating substrate 17 as shown in FIG. 9.

The respective ground conductor patterns G11, G12, G13, and G14 shown in FIG. 9 are connected via interlayer connection conductors. Particularly, some of these interlayer connection conductors are located immediately below the third electrode pad P31 as shown in FIGS. 8A and 9.

As shown in FIG. 9, the first ground conductor pattern G11 (FIG. 8B) exposed from the openings in the resist film RF (FIGS. 7 and 8A) provides each of the second electrode pad P21 (FIGS. 7 and 8A) and the third electrode pad P31 (FIGS. 7 and 8A).

The structure of the second transmission line 202 (FIG. 7) is the same or substantially the same as the structure of the first transmission line 102 (FIG. 7).

According to the present preferred embodiment, as shown in FIG. 7, the second electrode pad P21, the sixth electrode pad P61, the third electrode pad P31, and the fifth electrode pad P51 have shapes along the peripheries of the first electrode pads P11, P12, and P13 and the fourth electrode pads joined thereto. Therefore, the reinforcing action by the second electrode pad P21 and the sixth electrode pad P61 and the reinforcing action by the third electrode pad P31 and the fifth electrode pad P51 are improved.

Further, as shown in FIG. 7, the second electrode pad P22 and the third electrode pad P32 are located at positions sandwiching the first electrode pad P12 in a direction (direction along the Y axis) orthogonal or substantially orthogonal to the extending direction of the first signal conductor patterns SL11, SL12, and SL13 (FIG. 9). Therefore, at the joint portion between the first transmission line and the second transmission line, the peeling resistance of the joint portion increases against stress that tends to bend the orthogonal direction (width direction) to the extending direction of the first signal conductor pattern and the second signal conductor pattern in the stacking direction of the insulating substrate. In particular, even when a torsional stress as shown in FIG. 6 is applied, the joint strength of the joint portion between the first transmission line and the second transmission line to the stress is increased.

Third Preferred Embodiment

In a third preferred embodiment of the present invention, an example in which the configuration of the conductor pattern at the joint portion between the first transmission line and the second transmission line is different from those in the first and second preferred embodiments will be described.

Figure 10:
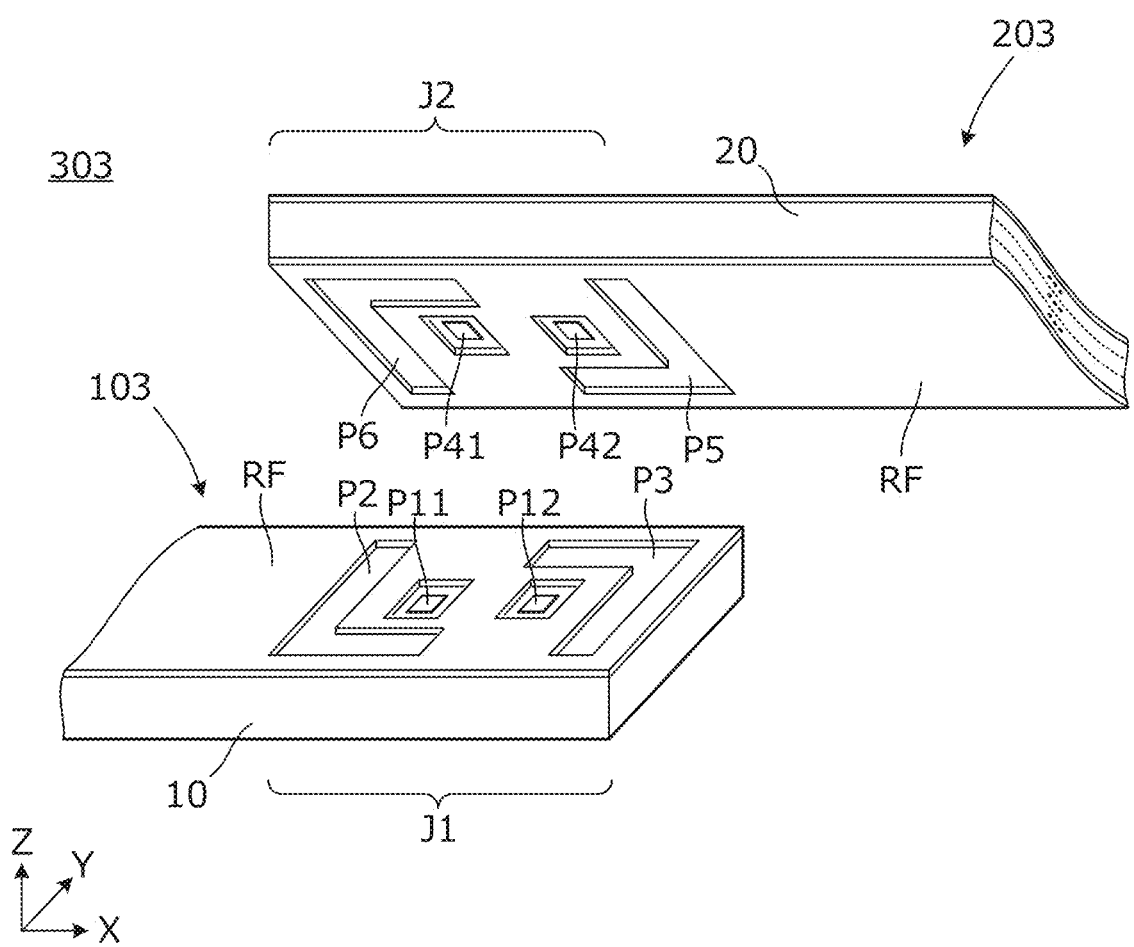
FIG. 10 is a perspective view of a transmission line device according to a third preferred embodiment of the present invention.

FIG. 10 is a perspective view of a transmission line device 303 according to the third preferred embodiment, and includes X-Y-Z coordinate axes that correspond to the three-dimensional arrangement of the transmission line device 303. FIG. 10 shows a state before a first transmission line 103 and a second transmission line 203 are joined. In the transmission line device 303, the first transmission line 103 and the second transmission line 203 are joined.

The first transmission line 103 includes two first signal conductor patterns, first electrode pads P11 and P12 that are respectively electrically connected to the first signal conductor patterns, and a second electrode pad P2 and a third electrode pad P3 that are portions of the first ground conductor pattern.

The second transmission line 203 includes two second signal conductor patterns, fourth electrode pads P41 and P42 that are respectively electrically connected to the second signal conductor patterns, and a fifth electrode pad P5 and a sixth electrode pad P6 that are portions of the second ground conductor pattern.

The second electrode pad P2 is L-shaped along the periphery of the first electrode pad P11, and the sixth electrode pad P6 is L-shaped along the periphery of the fourth electrode pad P41. Similarly, the third electrode pad P3 is L-shaped along the periphery of the first electrode pad P12, and the fifth electrode pad P5 is L-shaped along the periphery of the fourth electrode pad P42.

Other configurations are the same or substantially the same as those shown in the first and second preferred embodiments.

According to the present preferred embodiment, as in the case of the second preferred embodiment, the reinforcing action by the second electrode pad P2 and the sixth electrode pad P6 and the reinforcing action by the third electrode pad P3 and the fifth electrode pad P5 are improved. Further, even when a torsional stress is applied to the joint portion between the first transmission line and the second transmission line, the joint strength of the joint portion between the first transmission line and the second transmission line to the stress is increased.

Other Preferred Embodiments

The above-described preferred embodiments are merely non-limiting examples in all respects and are not restrictive.

Modifications and changes can be made as appropriate by those skilled in the art. The scope of the present invention is shown not by the above preferred embodiments but by the claims. Furthermore, the scope of the present invention includes modifications to the preferred embodiments within the scope equivalent to the claims.

For example, the second electrode pad and the third electrode pad may not be portions of the first ground conductor pattern, but may be electrodes that are electrically connected to the first ground conductor pattern via an interlayer connection conductor or the like. Similarly, the fifth electrode pad and the sixth electrode pad may not be portions of the second ground conductor pattern, but may be electrodes that are electrically connected to the second ground conductor pattern via an interlayer connection conductor or the like.

In the example shown in FIG. 7, the U-shaped electrode pads face each other, but one of the electrode pads may be U-shaped and the other electrode pad may be I-shaped or L-shaped, for example. In the example shown in FIG. 10, the L-shaped electrode pads face each other, but one of the electrode pads may be L-shaped and the other electrode pad may be I-shaped, for example.

In addition, in the example shown in FIG. 7, the U-shaped electrode pads are opposed to each other along the surface, but one of the electrode pads may be U-shaped and the other electrode pad may be I-shaped or L-shaped, for example. Further, in the example shown in FIG. 10, the L-shaped electrode pads are opposed to each other along the surface, but one of the electrode pads may be L-shaped and the other electrode pad may be I-shaped, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line device comprising:
   a first transmission line including a plurality of first insulating substrates that are stacked and a first conductor pattern located on the plurality of first insulating substrates; and
   a second transmission line including a plurality of second insulating substrates that are stacked and a second conductor pattern located on the plurality of second insulating substrates; wherein
   the plurality of first insulating substrates and the plurality of second insulating substrates are respectively made of a same material;
   the first conductor pattern includes a first signal conductor pattern, a first ground conductor pattern, a first electrode pad that is electrically connected to the first signal conductor pattern, and a second electrode pad and a third electrode pad that are electrically connected to the first ground conductor pattern or are portions of the first ground conductor pattern;
   the second conductor pattern includes a second signal conductor pattern, a second ground conductor pattern, a fourth electrode pad that is electrically connected to the second signal conductor pattern, and a fifth electrode pad and a sixth electrode pad that are electrically connected to the second ground conductor pattern or are portions of the second ground conductor pattern;
   the first electrode pad, the second electrode pad, and the third electrode pad are arranged on a same plane, and the first electrode pad is disposed between the second electrode pad and the third electrode pad;
   the fourth electrode pad, the fifth electrode pad, and the sixth electrode pad are arranged on a same plane, and the fourth electrode pad is disposed between the fifth electrode pad and the sixth electrode pad;
   the second electrode pad and the third electrode pad are larger than the first electrode pad;
   the fifth electrode pad and the sixth electrode pad are larger than the fourth electrode pad; and
   the first electrode pad and the fourth electrode pad are connected to each other, the second electrode pad and the sixth electrode pad are connected to each other, and the third electrode pad and the fifth electrode pad are connected to each other.

2. The transmission line device according to claim 1, wherein
   the first electrode pad and the fourth electrode pad are connected to each other by solder paste;
   the second electrode pad and the sixth electrode pad are connected to each other by solder paste; and
   the third electrode pad and the fifth electrode pad are connected to each other by solder paste.

3. The transmission line device according to claim 1, wherein
   the first ground conductor pattern includes two ground conductor patterns sandwiching the first signal conductor pattern in a stacking direction of the plurality of first insulating substrates, and a first interlayer connection conductor that electrically connects the two ground conductor patterns, the second electrode pad, and the third electrode pad; and
   the second ground conductor pattern includes two ground conductor patterns sandwiching the second signal conductor pattern in a stacking direction of the plurality of second insulating substrates, and a second interlayer connection conductor that electrically connects the two ground conductor patterns, the fifth electrode pad, and the sixth electrode pad.

4. The transmission line device according to claim 3, wherein the first interlayer connection conductor is located immediately adjacent to at least one of the second electrode pad or the third electrode pad in a stacking direction of the plurality of first insulating substrates, and the second interlayer connection conductor is located immediately adjacent to at least one of the fifth electrode pad or the sixth electrode pad in a stacking direction of the plurality of second insulating substrates.

5. The transmission line device according to claim 4, wherein the first interlayer connection conductor includes a plurality of first interlayer connection conductors located immediately adjacent to at least one of the second electrode pad or the third electrode pad in the stacking direction of the plurality of first insulating substrates, and the second interlayer connection conductor includes a plurality of second interlayer connection conductors located immediately adjacent to at least one of the fifth electrode pad or the sixth electrode pad in the stacking direction of the plurality of second insulating substrates.

6. The transmission line device according to claim 1, wherein the second electrode pad and the third electrode pad sandwich the first electrode pad in an extending direction of the first signal conductor pattern, and the fifth electrode pad and the sixth electrode pad sandwich the fourth electrode pad in an extending direction of the second signal conductor pattern.

7. The transmission line device according to claim 1, wherein the second electrode pad and the third electrode pad sandwich the first electrode pad in a direction orthogonal or substantially orthogonal to an extending direction of the first signal conductor pattern, and the fifth electrode pad and the sixth electrode pad sandwich the fourth electrode pad in a direction orthogonal or substantially orthogonal to an extending direction of the second signal conductor pattern.

8. The transmission line device according to claim 1, further comprising:
   a first coaxial connector connected to an end of the first signal conductor pattern; and
   a second coaxial connector connected to an end of the second signal conductor pattern.

9. The transmission line device according to claim 1, wherein each of the plurality of first insulating substrates and the plurality of second insulating substrates is respectively made of liquid crystal polymer or poly ether ether ketone.

10. The transmission line device according to claim 1, wherein
   a first resist film is located on an upper surface of the first transmission line; and
   a second resist film is located on a lower surface of the second transmission line.

11. The transmission line device according to claim 10, wherein the first and second resist films are respectively made of resin.

12. The transmission line device according to claim 1, wherein the first and second conductor patterns are made of Cu foil.

13. The transmission line device according to claim 1, wherein at least one of the second electrode pad, the third electrode pad, the fifth electrode pad, and the sixth electrode pad is L-shaped or U-shaped disposed along a periphery of the first electrode pad.

14. The transmission line device according to claim 13, wherein each of the second electrode pad, the third electrode pad, the fifth electrode pad, and the sixth electrode pad are L-shaped along a periphery of the first electrode pad.

15. The transmission line device according to claim 13, wherein each of the second electrode pad, the third electrode pad, the fifth electrode pad, and the sixth electrode pad are U-shaped along a periphery of the first electrode pad.

* * * * *